(12) United States Patent
Colonna et al.

(10) Patent No.: US 9,224,796 B2
(45) Date of Patent: Dec. 29, 2015

(54) PROCESS FOR PRODUCING A THROUGH-SILICON VIA AND A THROUGH-SILICON CAPACITOR IN A SUBSTRATE, AND CORRESPONDING DEVICE

(71) Applicants: STMicroelectronics (Crolles 2) SAS, Crolles (FR); Commissariat a L'Energie Atomique et aux Energies Alternatives, Paris (FR)

(72) Inventors: Jean-Philippe Colonna, Corenc (FR); Sylvain Joblot, Grenoble (FR); Thierry Mourier, Meylan (FR); Olivier Guiller, Fontaine (FR)

(73) Assignees: STMicroelectronics (Crolles 2) SAS, Crolles (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/306,934

(22) Filed: Jun. 17, 2014

(65) Prior Publication Data
US 2014/0367828 A1 Dec. 18, 2014

(30) Foreign Application Priority Data
Jun. 18, 2013 (FR) ..................................... 13 55710

(51) Int. Cl.
| | | |
|---|---|---|
| *H01L 21/20* | (2006.01) | |
| *H01L 49/02* | (2006.01) | |
| *H01L 23/48* | (2006.01) | |

(Continued)

(52) U.S. Cl.
CPC .......... *H01L 28/40* (2013.01); *H01L 21/76898* (2013.01); *H01L 23/481* (2013.01); *H01L 23/642* (2013.01); *H01L 28/90* (2013.01); *H01L 2924/0002* (2013.01)

(58) Field of Classification Search
CPC . H01L 28/40; H01L 23/481; H01L 21/76898; H01L 23/642; H01L 28/90
USPC ........................................................ 438/386
See application file for complete search history.

(56) References Cited

U.S. PATENT DOCUMENTS 8,294,240 B2 * 10/2012 Nowak et al. ................. 257/532
2006/0001174 A1 1/2006 Matsui
(Continued)

FOREIGN PATENT DOCUMENTS

FR 2968130 A1 6/2012

OTHER PUBLICATIONS

INPI Search Report and Written Opinion for FR 1355710 mailed Mar. 6, 2014 (9 pages).

(Continued)

*Primary Examiner* — Luan C Thai
(74) *Attorney, Agent, or Firm* — Gardere Wynne Sewell LLP

(57) ABSTRACT

A device includes a substrate and an integrated-circuit interconnect on a first side. A capacitor passes through the substrate possessing a first electrode having a first contact face electrically coupled to a first electrically conductive zone placed on a second side of the substrate and a second electrode electrically coupled to the interconnect. A through-silicon via passes through the substrate having at one end a first contact face electrically coupled to a second electrically conductive zone placed on said second side of the substrate and at the other end a part electrically coupled to the interconnect part. The two first contact faces are located in the same plane.

17 Claims, 18 Drawing Sheets

(51) Int. Cl.
*H01L 21/768* (2006.01)
*H01L 23/64* (2006.01)

(56) References Cited

U.S. PATENT DOCUMENTS

2010/0308435 A1 12/2010 Nowak et al.
2011/0027962 A1 2/2011 Bernstein et al.
2012/0133020 A1* 5/2012 Joblot et al. ................ 257/532
2012/0133021 A1* 5/2012 Joblot et al. ................ 257/532
2012/0258589 A1 10/2012 Volant et al.

OTHER PUBLICATIONS

Joshi et al: "Low Cost On-Chip Passive Devices Formed by Through Silicon VIAS" IP Com Journal West Henrietta NY US (Feb. 1, 2011).

* cited by examiner

PROCESS FOR PRODUCING A THROUGH-SILICON VIA AND A THROUGH-SILICON CAPACITOR IN A SUBSTRATE, AND CORRESPONDING DEVICE

PRIORITY CLAIM

This application claims priority from French Application for Patent No. 1355710 filed Jun. 18, 2013, the disclosure of which is incorporated by reference.

TECHNICAL FIELD

The invention relates to semiconductor devices, in particular to through-silicon vias (or through-silicon connections) and to capacitors produced in semiconductor devices.

BACKGROUND

French patent application No. 1059919 (the disclosure of which is incorporated by reference) describes a semiconductor structure comprising a through-silicon via and a capacitor passing through the substrate. However, the electrical connection of the capacitor on one of the sides of the substrate requires provision to be made for the formation of a secondary hole for housing an electrical connecting means therein. A complication of the fabrication process therefore results.

Furthermore, the fabrication process described in this French patent application is not compatible with through-silicon vias (TSVs) and capacitors having the same diameter, and therefore the same depth during production. A risk of TSV breakage therefore results during fabrication.

SUMMARY

According to one method of implementation, a process is provided that allows through vias and capacitors to be produced more simply in a substrate of an integrated structure, and that is perfectly compatible with through vias and capacitors having, in particular, identical diameters, and therefore identical depths.

According to one aspect, a process is provided for producing at least one through-silicon via and at least one through-silicon capacitor in a substrate.

The process according to this aspect comprises: forming, in the substrate from a first side, at least one first blind orifice intended for forming the capacitor and at least one second blind orifice intended for forming the through-silicon via; forming a first electrode region of said capacitor at least on the side walls and on the bottom wall of the first blind orifice, said forming said first electrode region including forming, for example depositing, an initial electrically conductive layer in said first blind orifice; filling the first blind orifice and the second blind orifice by forming in the first orifice a multilayer comprising at least one dielectric layer and an additional electrically conductive layer on said dielectric layer, the additional layer forming a second electrode region of said capacitor, and by forming in the second orifice a multilayer comprising at least the additional layer in order to form at least one part of said through via; thinning the substrate from a second side until the first and second blind orifices are exposed and the first electrode region in the first orifice is reached and the multilayer filling the second orifice is reached allowing the through-silicon via to be formed, said initial electrically conductive layer being not present in the bottom of said second orifice after said thinning step; and producing a first electrically conductive zone making contact with said electrode region and a second electrically conductive zone making contact with said through-silicon via, these two zones possibly forming part, for example, of a redistribution layer (RDL).

In one embodiment said additional electrically conductive layer present in said first orifice and said additional electrically layer present in said second orifice are obtained by the formation, for example a deposition, of a same electrically conductive layer.

In one embodiment, the thinning of the substrate comprises forming a planar side onto which both the at least one part of said additional layer located in the first blind orifice and a part of the bottom portion of the first electrode region open, and the first electrically conductive zone making contact with said first electrode region and the second electrically conductive zone making contact with said through-silicon via are produced on said planar side.

Thus, the fact that the two contact faces of the first electrode region, on the one hand, and the through via, on the other hand, with the redistribution layer are located in the same plane simplifies the production process and especially makes it possible to avoid having to form a secondary hole as in the prior art.

The process may also comprise forming, on said first side, an integrated-circuit interconnect part making contact with said additional layers of the first and second orifices.

Moreover, such a process is applicable whether the blind orifices have the same depth or not, which is to say whether they have the same diameter or not.

Thus, as a first variant, the blind orifices have the same depth, and therefore the same diameter, and the height of the bottom portion of the first electrode region is greater than the distance separating the bottom wall of the second blind orifice from said additional layer contained in this second blind orifice. This especially makes it possible, during the grinding step, to ensure a face of the first electrode region and a face of the through via lie in the same plane.

As another variant, the blind orifices may have different depths, the first blind orifice, i.e. that intended to receive the capacitor, being less deep than the second blind orifice, and the bottom end of the additional layer located in the second blind orifice is at a depth level located under the top level of the bottom portion of the first electrode region.

Here again this makes it possible to have the two contact faces, of the electrode of the capacitor, on the one hand, and of the through via, on the other hand, in the same plane during the grinding treatment.

In one method of implementation, formation of the first electrode region may comprise forming an initial electrically conductive layer by electrolysis from a first electrically conductive seed layer.

When the two blind orifices have the same diameter, the process may comprise depositing the first seed layer in each of the blind orifices and also on the first side of the substrate, and etching this first seed layer in a zone located on the first side of the substrate between the two blind orifices in order to prevent thinning the second blind orifice from being filled during the electrolysis operation.

In one embodiment, the filling of the blind orifices comprises forming said multilayer also on the first side of the substrate and removing the part of said multilayer on the first side of the substrate and removing the part of said multilayer located on the first side of the substrate external to the blind orifices.

According to another aspect, an electronic device is provided, comprising: a substrate; an integrated-circuit interconnect part placed on a first side of the substrate; at least one capacitor passing through said substrate, possessing a first electrode having a first contact face electrically coupled to a first electrically conductive zone placed on a second side of the substrate, and a second electrode electrically coupled to said interconnect part; and at least one through-silicon via passing through the substrate, having at one end a first contact face electrically coupled to a second electrically conductive zone placed on the second side of the substrate, and at the other end a part electrically coupled to said interconnect part, said two first contact faces being located in the same plane.

In one embodiment, the first electrode comprises a cylindrical part connected to a bottom portion possessing said first contact face, and the second electrode is located inside the cylindrical part of the first electrode.

In one embodiment, the through via comprises an electrically conductive central part a first end of which forms part of the first contact face and a second end of which is connected to said interconnect part, and a cylindrical dielectric region encircling said central part and a first end of which forms part of the first contact face.

In one embodiment, the through via may also comprise a cylindrical peripheral part encircling the central part and the dielectric region and a first end of which also forms part of the first contact face.

BRIEF DESCRIPTION OF THE DRAWINGS

Other advantages and features of the invention will become apparent on examining the detailed description of non-limiting embodiments and methods of implementation, and the appended drawings, in which.

DETAILED DESCRIPTION OF THE DRAWINGS

Reference is now more particularly made to FIGS. 1 to 13 in order to describe a first embodiment and method of implementation.

Figure 1:
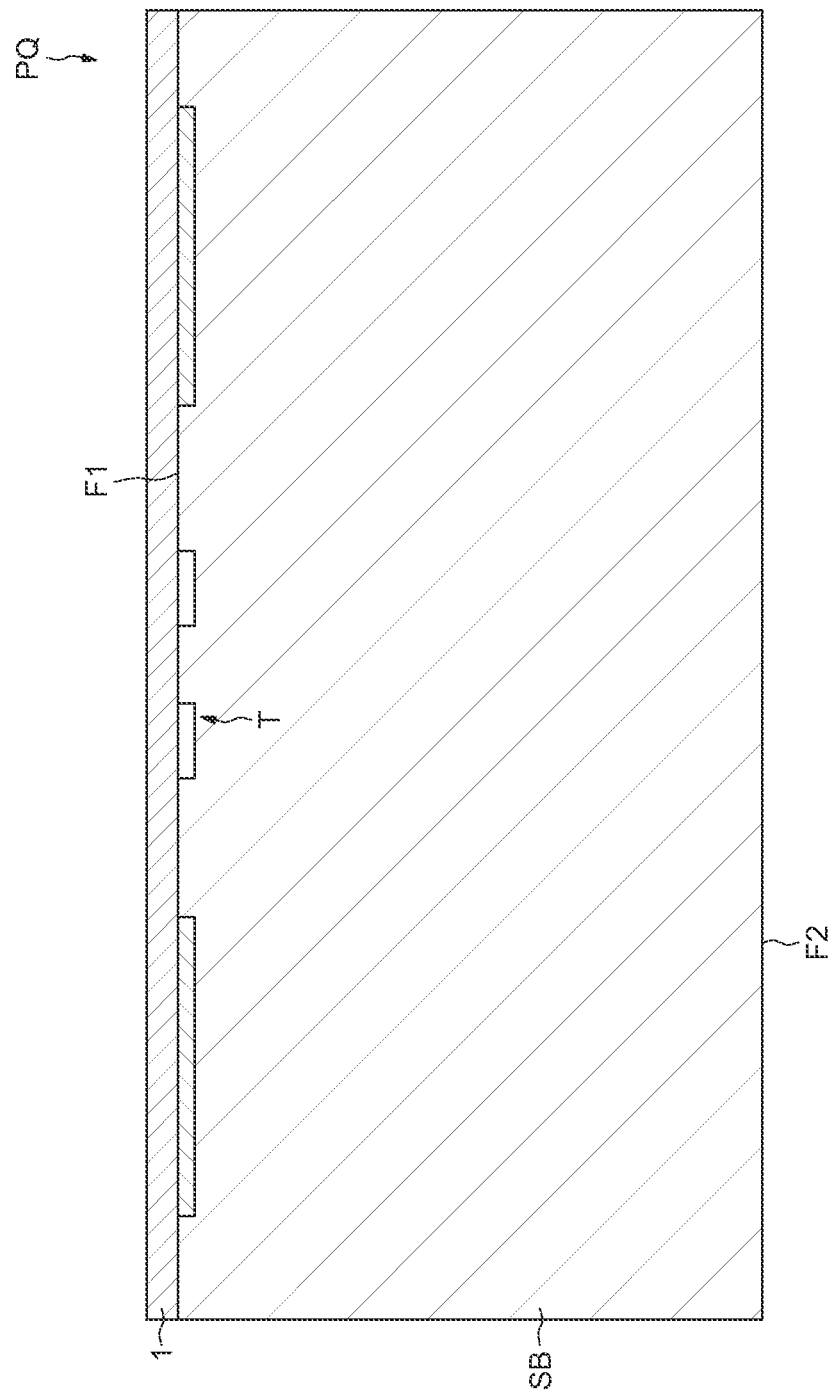
FIGS. 1 to 18 relate to various embodiments and methods of implementation of the process and device.

In FIG. 1, the reference PQ denotes a semiconductor wafer comprising a semiconductor substrate SB, for example made of silicon, on a front side of which integrated-circuit components, such as transistors T, have already been produced.

The side F1 or front side of the substrate SB is covered with an insulating layer 1, for example made of silicon oxide or silicon nitride.

The substrate SB also possesses a second side F2 or back side, opposite the first side.

Figure 2:
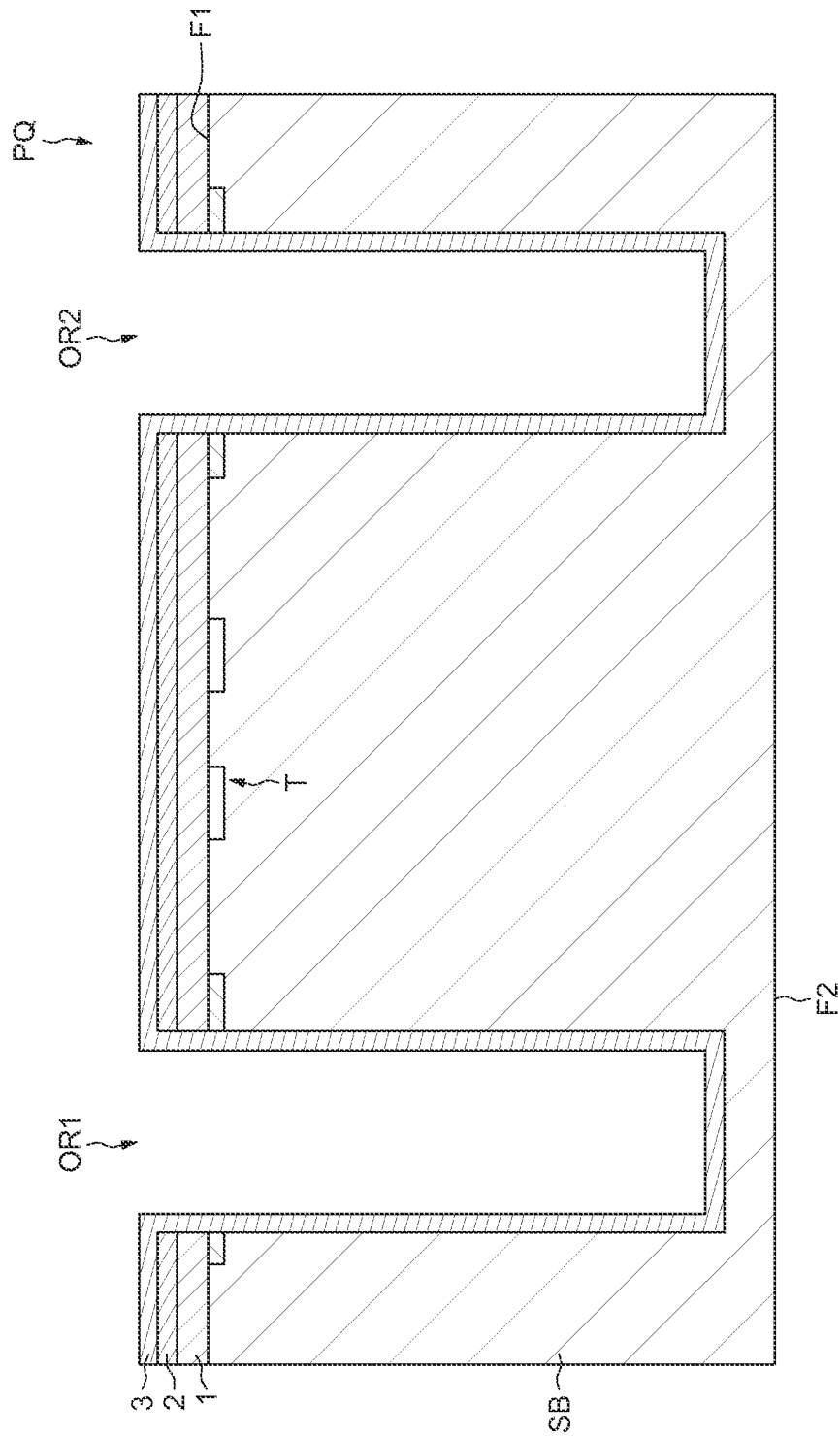

Next, as shown in FIG. 2, a hard mask layer 2 is deposited on the layer 1, which hard mask layer 2 is etched by a conventional photolithography operation in two locations in order to define the openings of two blind orifices OR1 and OR2.

Next, the layer 1 and the substrate SB are etched in order to form the first blind orifice OR1 and the second blind orifice OR2.

Of course, these orifices are etched in regions of the substrate free from components and/or integrated circuits.

In the example described here, the diameters of these two blind orifices, and therefore their etch depths, are identical.

By way of indication, the diameter of each blind orifice is about 10 microns, whereas the etch depth is about 80 to 85 microns.

Next, a passivation layer 3, for example made of silicon dioxide, is deposited on the structure and especially on the walls of the blind orifices.

Figure 3:
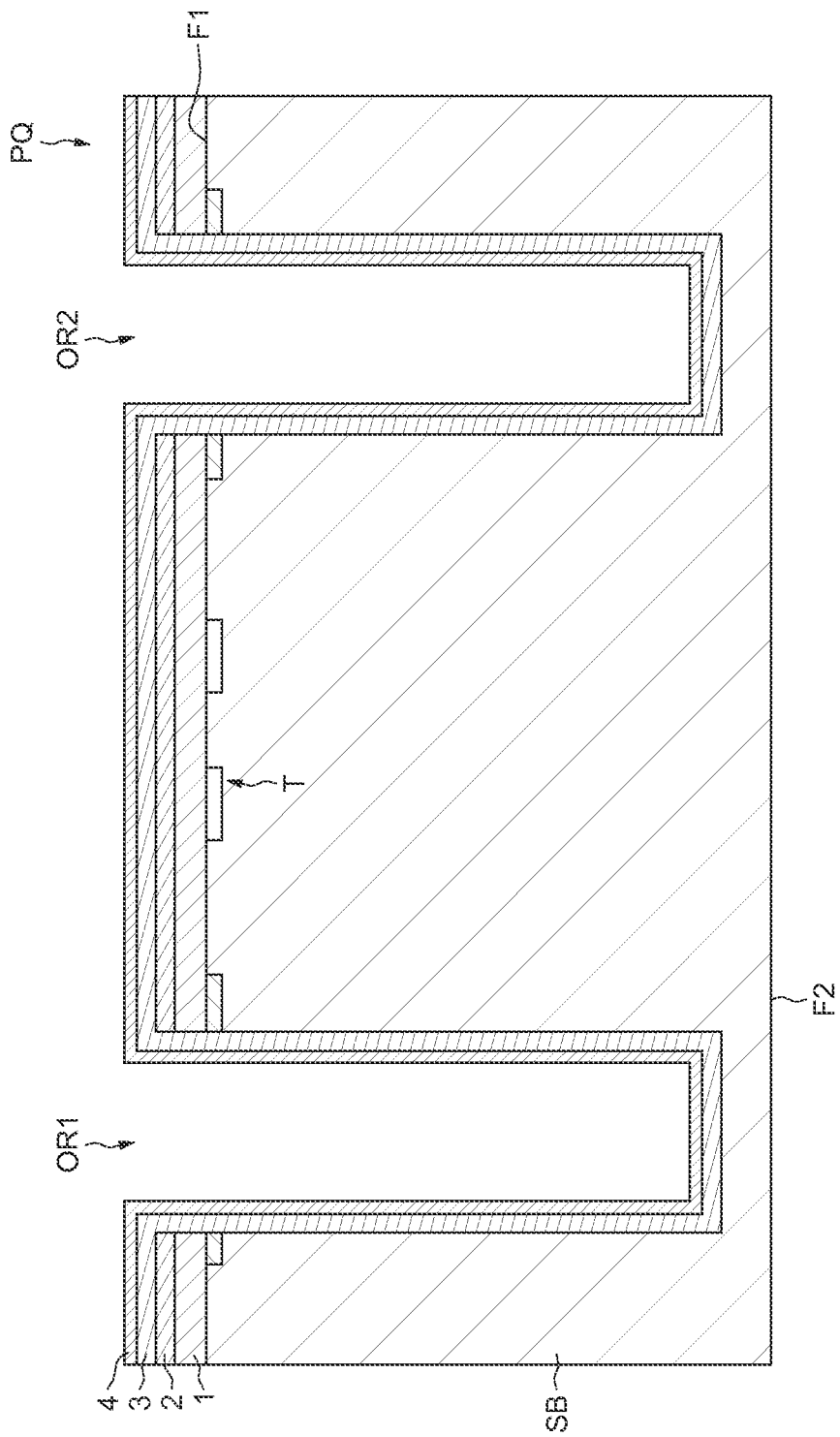

Next, as shown in FIG. 3, a first seed layer 4, for example of titanium, tantalum, or tantalum nitride, is deposited over all of the structure and on the side and bottom walls of the blind orifices OR1 and OR2.

Figure 4:
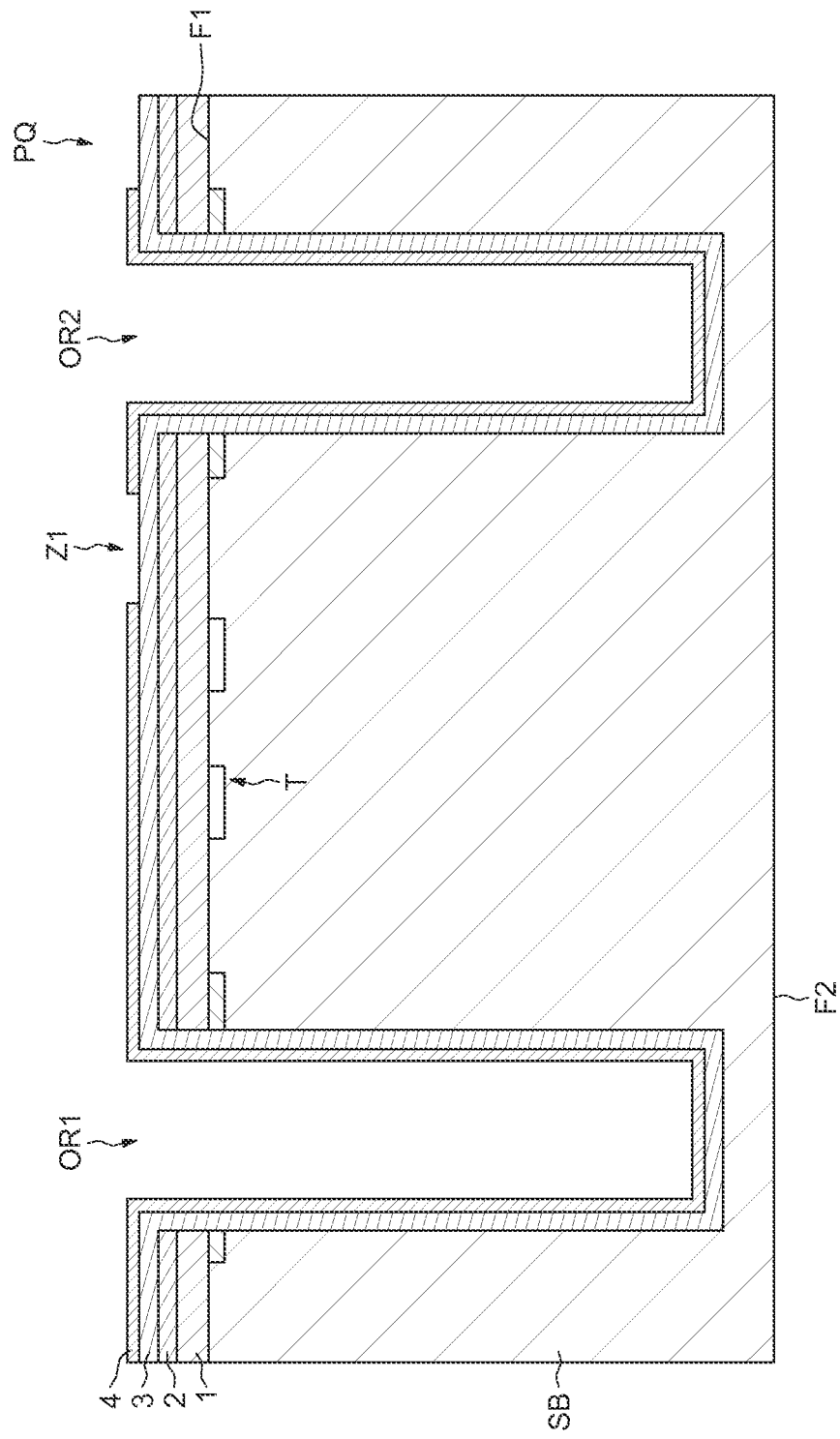

Next, as shown in FIG. 4, etching, typically chemical etching, of the seed layer 4 is carried out in a zone Z1 located on the side F1 of the substrate between the two blind orifices OR1 and OR2. In this example, the zone Z1 is in fact an annular ring around the second blind orifice OR2.

As a variant, it would be possible to deposit the seed layer only in the orifice OR1 or to remove the seed layer from the orifice OR2.

Figure 5:
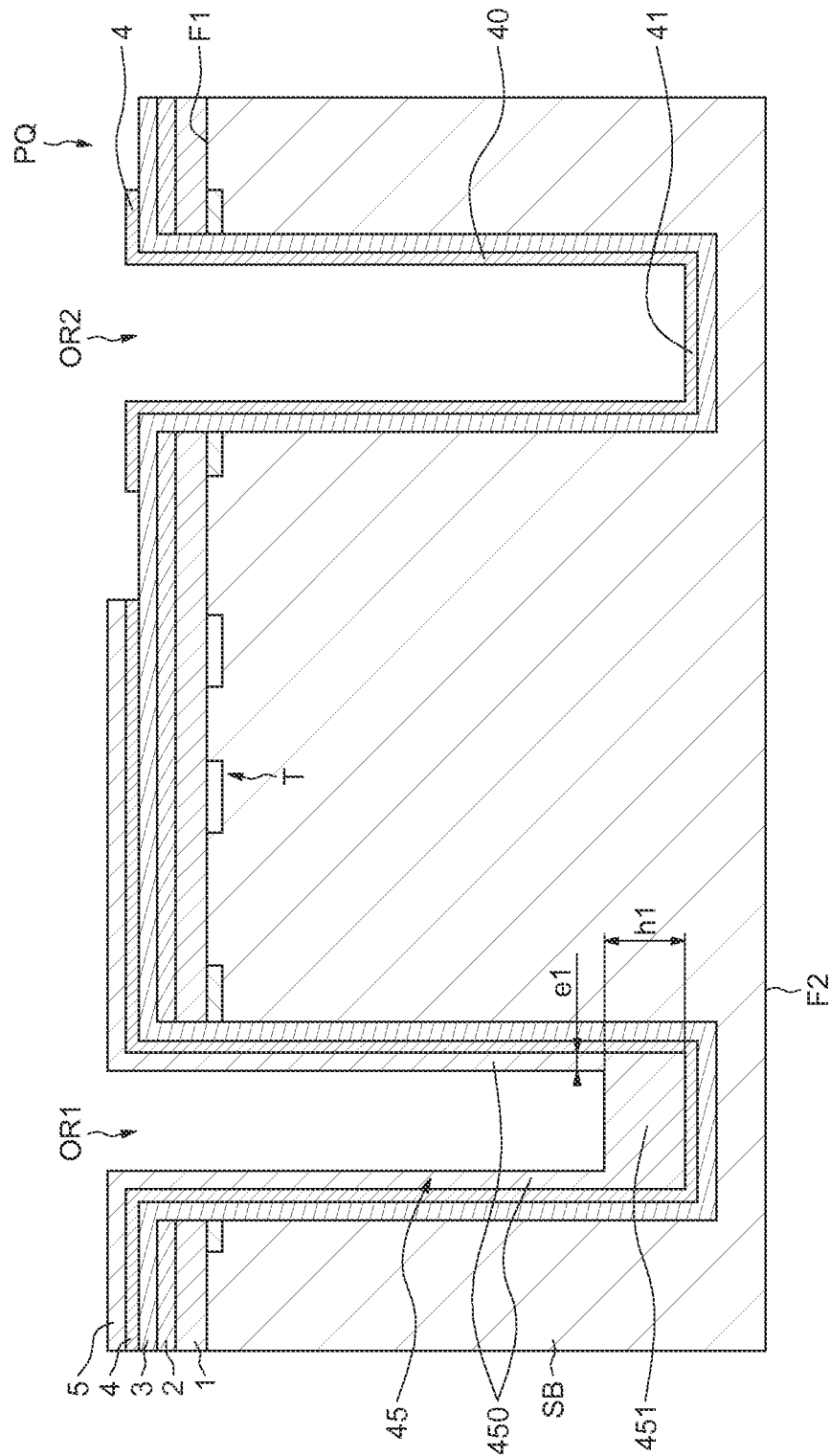

The first blind orifice OR1 is then partially filled with an initial layer 5 formed by electrolysis from the seed layer 4 (see, FIG. 5).

It will be noted here that the annular zone Z1 enabled the electrical isolation of the seed layer 4 located in the orifice OR2 in order to prevent the layer 5 forming by electrolysis in the orifice OR2.

This layer 5 may for example be made of copper. This layer 5 will form, in the orifice OR1, a first electrode region 45 comprising a tubular part (namely a part deposited on the vertical walls defining the orifice OR1) 450 connected to a bottom portion 451 typically having a height h1 typically of about 10 to 15 microns.

The height h1 is therefore greater than the thickness e1 of the copper layer deposited on the side walls of the orifice, this thickness e1 being, for example, about 1 micron or even less for a height h1 of about 10 microns.

Figure 6:
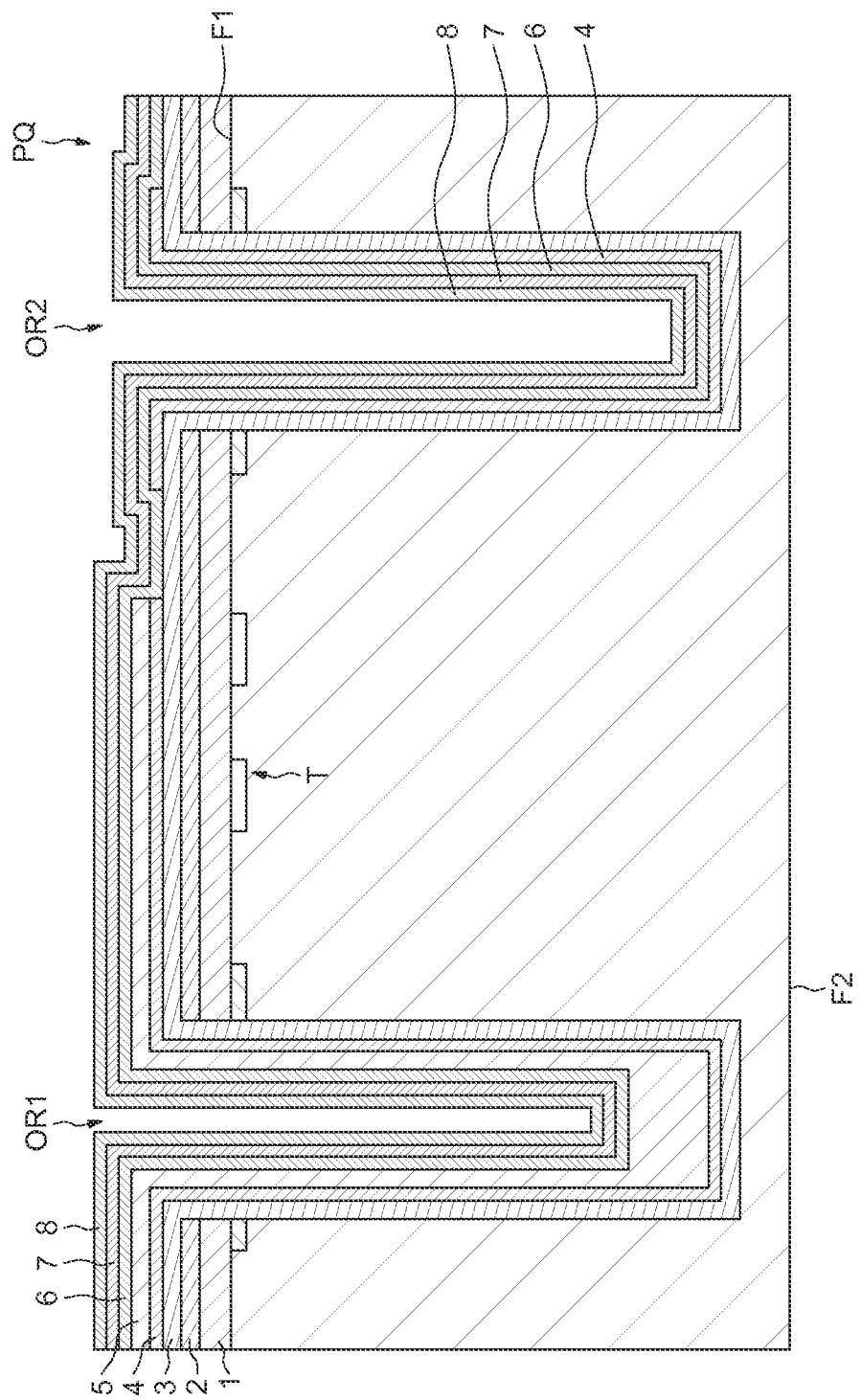

Next, as shown in FIG. 6, a multilayer of three layers containing a barrier layer 6, for example made of titanium nitride, surmounted by a dielectric layer 7 composed of a high-dielectric-strength oxide, for example $Ta_2O_5$ or alumina, surmounted by another barrier layer 8, also made of titanium nitride, is deposited on all of the structure and especially in the orifices OR1 and OR2.

Figure 7:
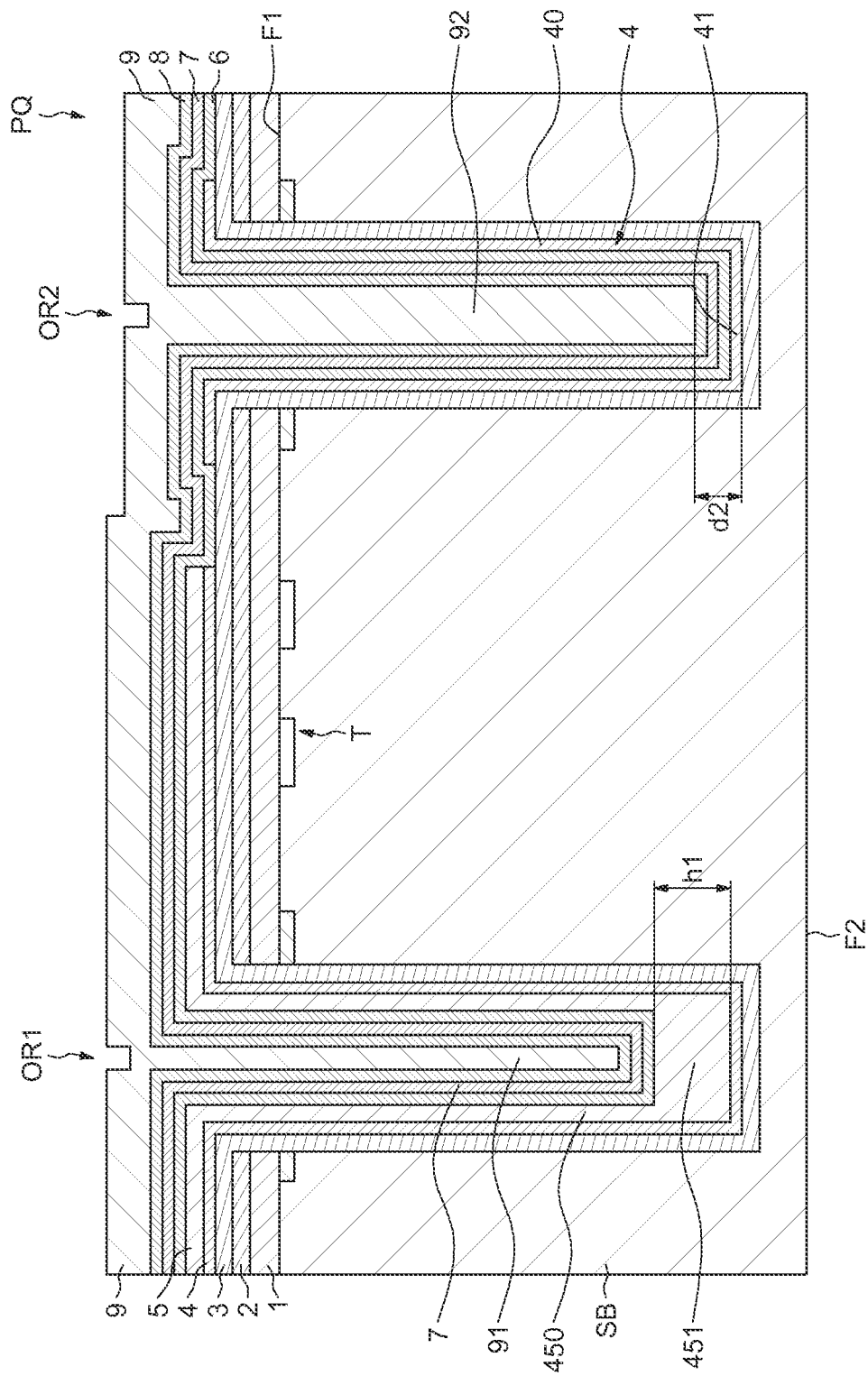

Next, as shown in FIG. 7, a second seed layer 8, of analogous composition to the first seed layer 4, is deposited on this multilayer, on which seed layer 8 a blanket electrically conductive layer 9, for example made of copper, will be deposited by electrolysis. This blanket layer 9 will completely fill the blind orifices OR1 and OR2 in order to form, in the blind orifice OR1, an additional layer 91 forming a second electrode region and, in the blind orifice OR2, an additional layer 92.

It should be noted here that since the barrier layer is conductive, it contributes to the formation of the two electrodes of the capacitor.

It will be noted here that the height h1 of the bottom portion 451 of the first electrode region 45 is greater than the distance d2 separating the layer 3 of the second blind orifice OR2 from the additional layer 92 contained in this second blind orifice.

Figure 8:
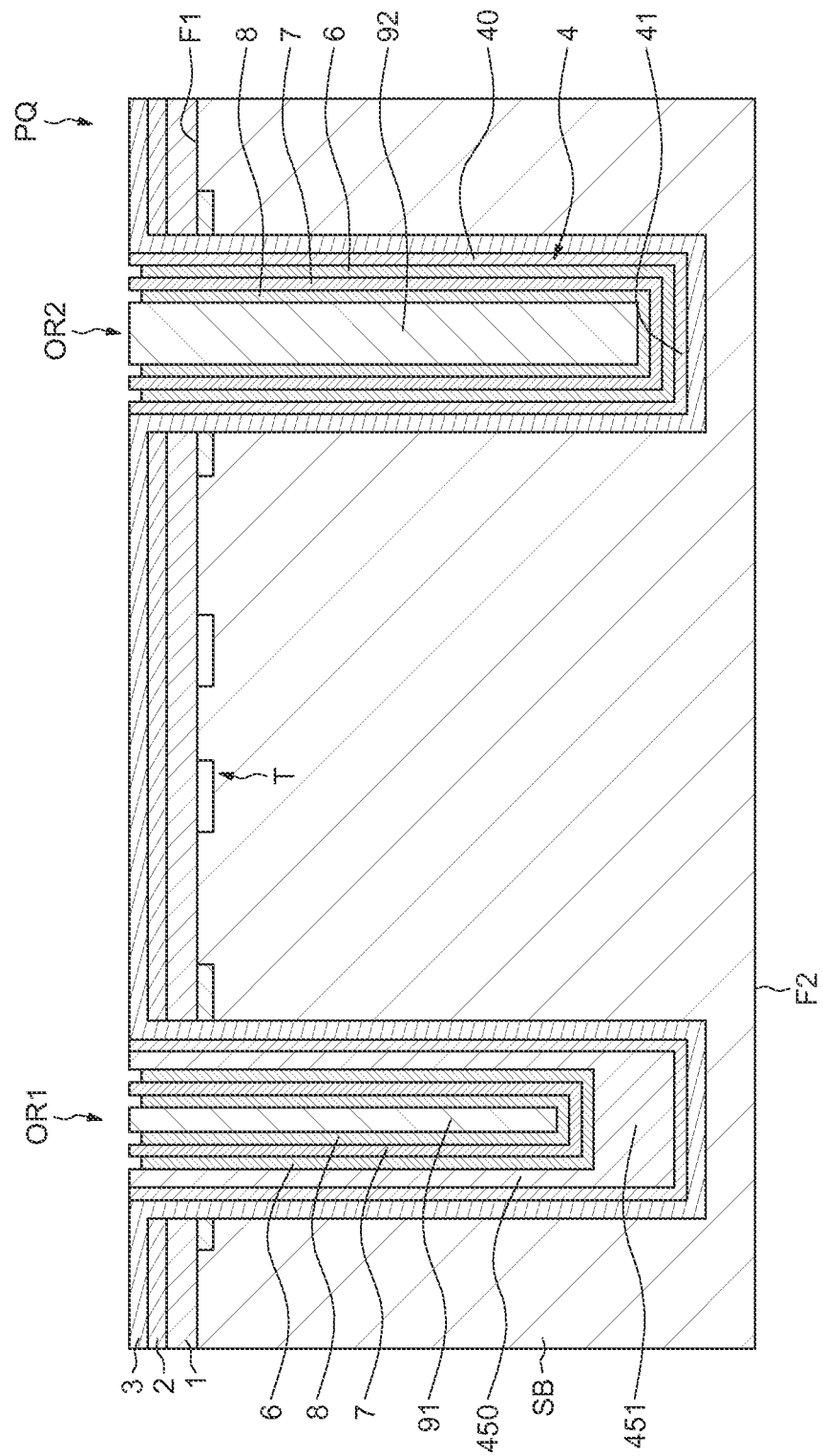
Figure 9:
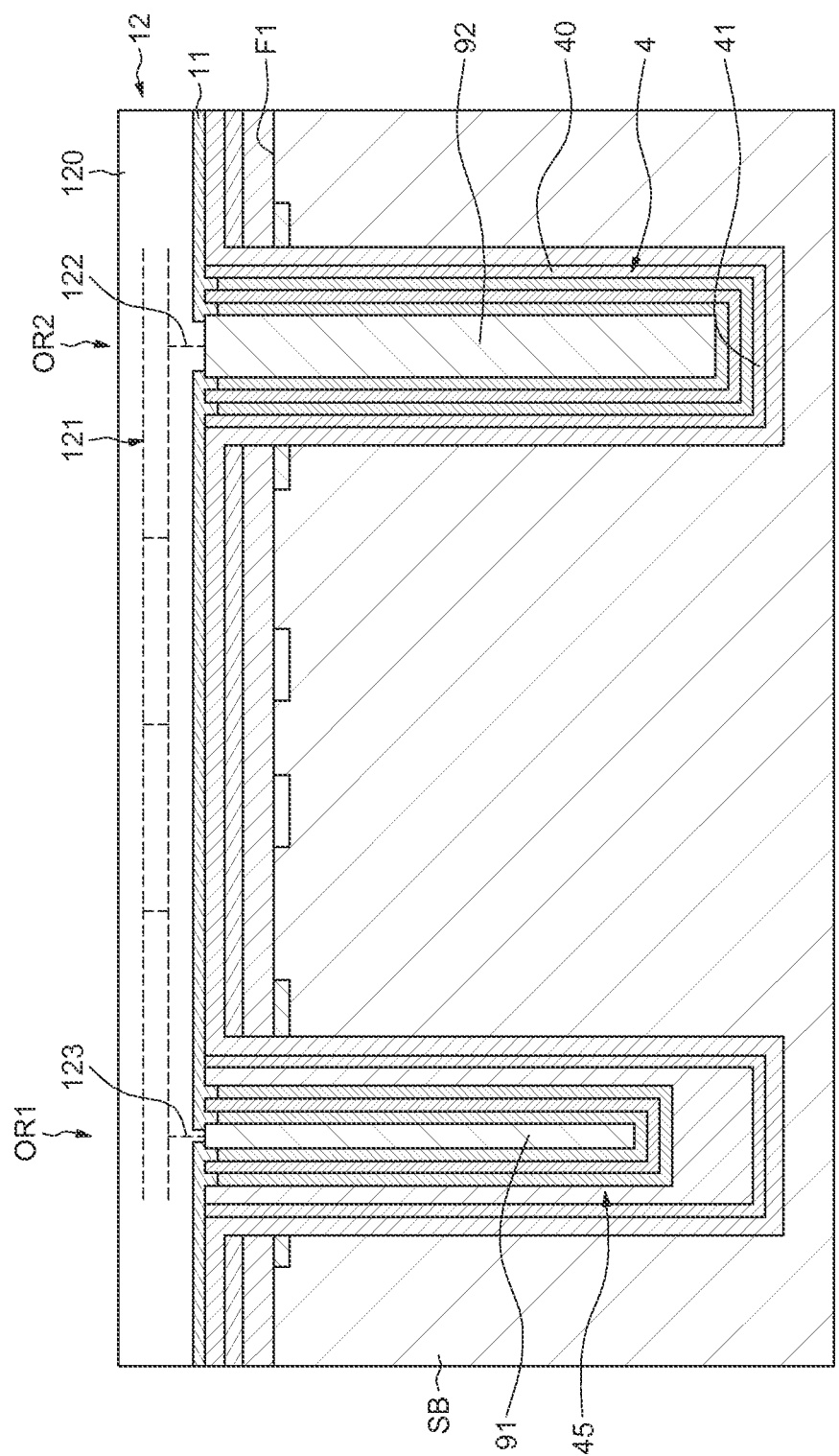

Next, as shown in FIG. 8, the part of the multilayer of layers 4 to 9 located on the side F1 of the substrate is removed. This removal for example comprises a chemical-mechanical polish and allows the contents of the blind orifices OR1, OR2 to be leveled.

Next, after a passivation layer 11, for example made of silicon dioxide or silicon nitride, has been deposited (see, FIG. 9), the (BEOL—back end of line) integrated-circuit interconnect part 12 is produced in the conventional way, as is known per se. Such an interconnect part 12 conventionally comprises, as is known per se, metallization levels and via levels encapsulated in an insulating region 120. The metallization levels comprise metal tracks 121.

It may be seen here that the passivation layer especially allows the first electrode region 45 to be isolated whereas a via 123 electrically connects the second electrode region 91 to the interconnect part 120. Likewise, a via 122 connects the conductive central part 92 to the interconnect part 12.

Figure 10:
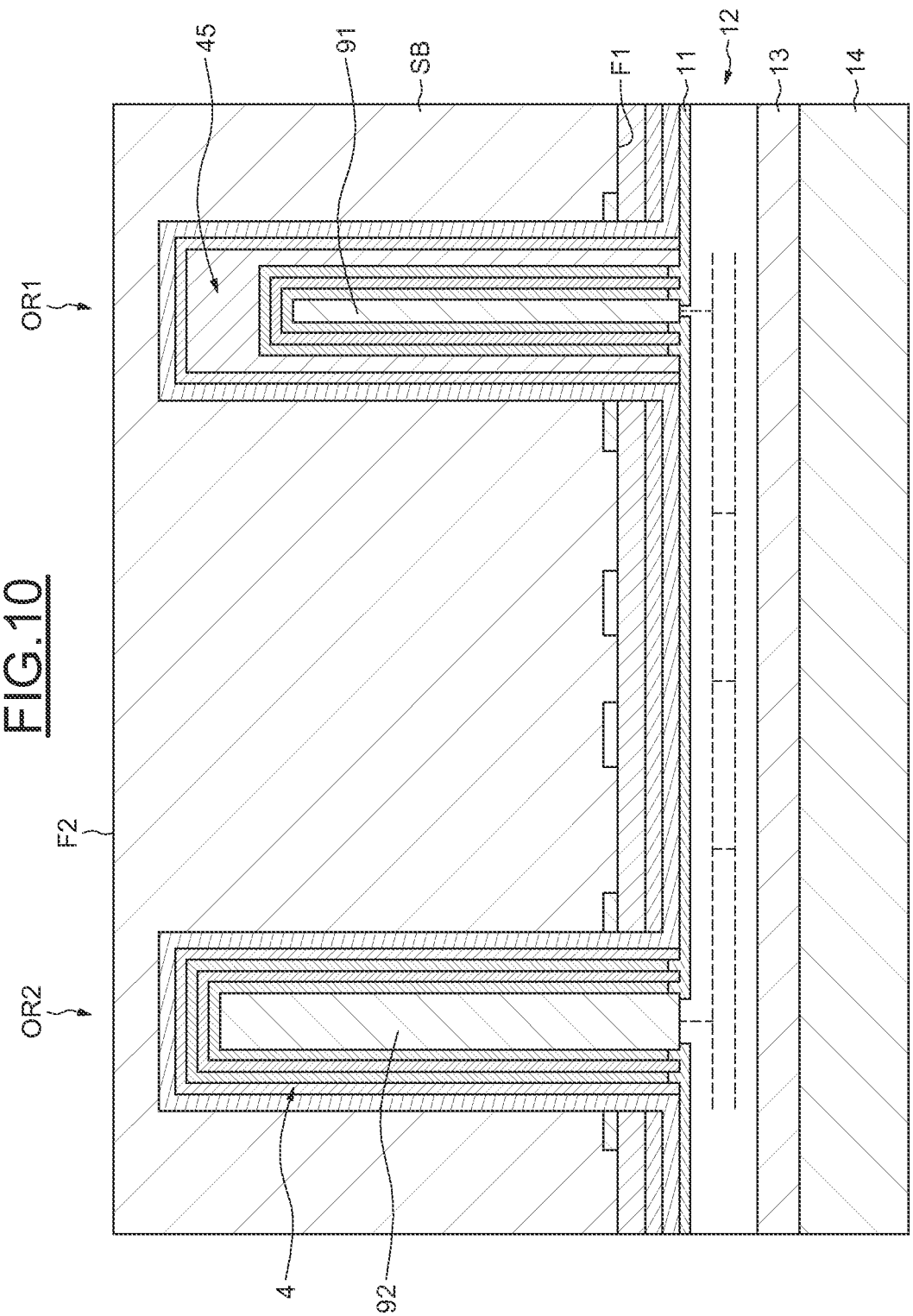

Next, as shown in FIG. 10, a carrier 14 is temporarily bonded to the interconnect part 12 by means of an adhesive 13, thereby allowing the blind orifices OR1, OR2 to be subjected to a grinding treatment from the second side F2 of the substrate SB, as will now be described with reference to FIGS. 11 and 12.

Figure 11:
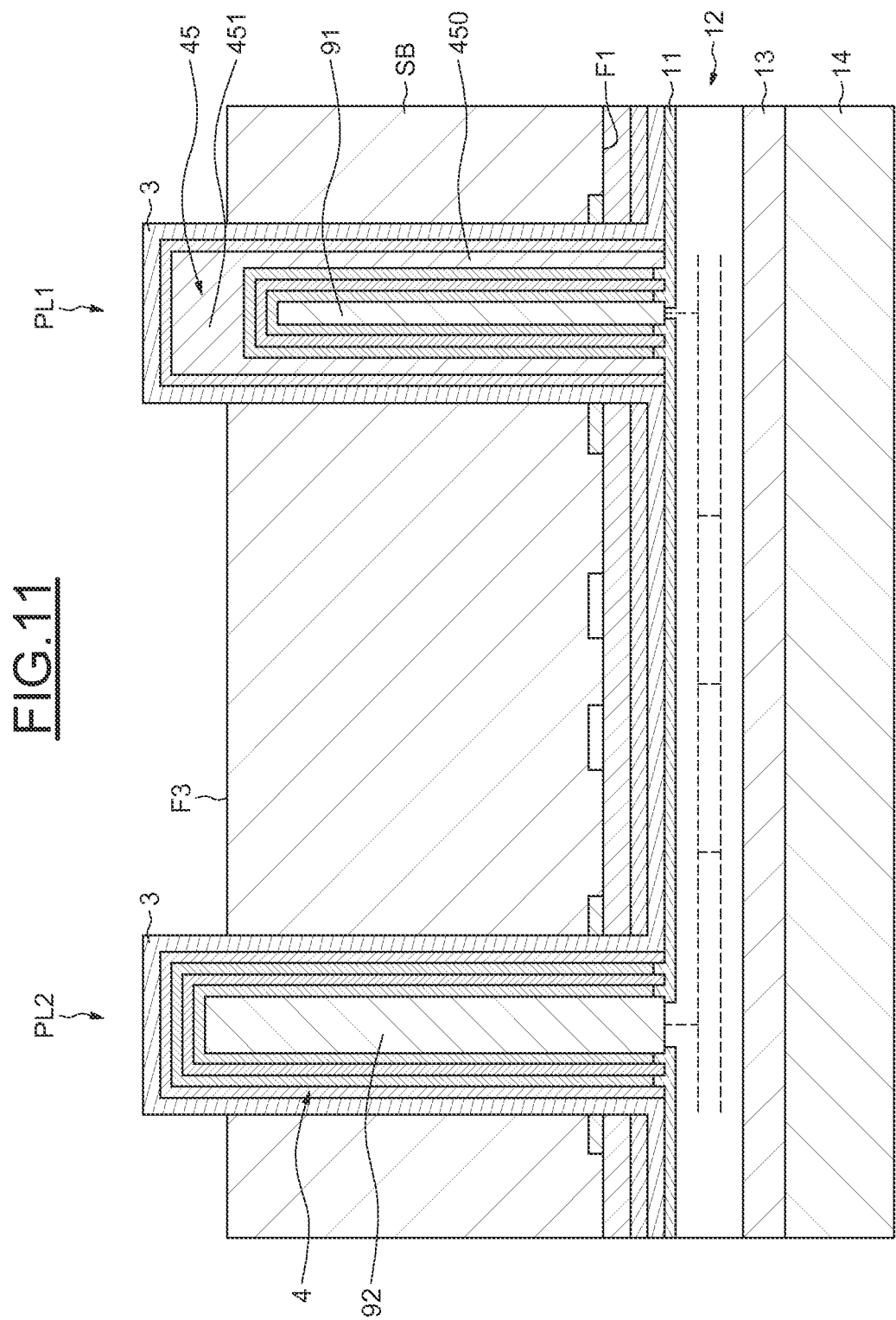

More precisely, as illustrated in FIG. 11, the substrate SB is first thinned from the back side F2 and then the silicon of the substrate SB is etched, with an etch that is selective over the material of the passivation layer 3, in order to obtain an intermediate substrate back side F3 from which pillars PL1 and PL2, due to the multilayer contained in the blind orifices OR1, OR2, protrude.

Next, a layer 15 of a material, for example of silicon oxynitride SiON, is deposited on the back side of the structure in FIG. 11, and a planarization step is performed in order to obtain a planar back side F4.

By way of this grinding treatment, both the central region 92 and the bottom portion 451 (FIG. 12) of the first electrode region 45 are ground down. However, on account of the condition imposed on the heights h1 and d2, a ground bottom portion 4510 possessing a back contact face F41 that is located in the same plane as the back contact face F42 of the ground multilayer (and especially of the ground central part 920) of the future through via, nevertheless remains.

Figure 13:
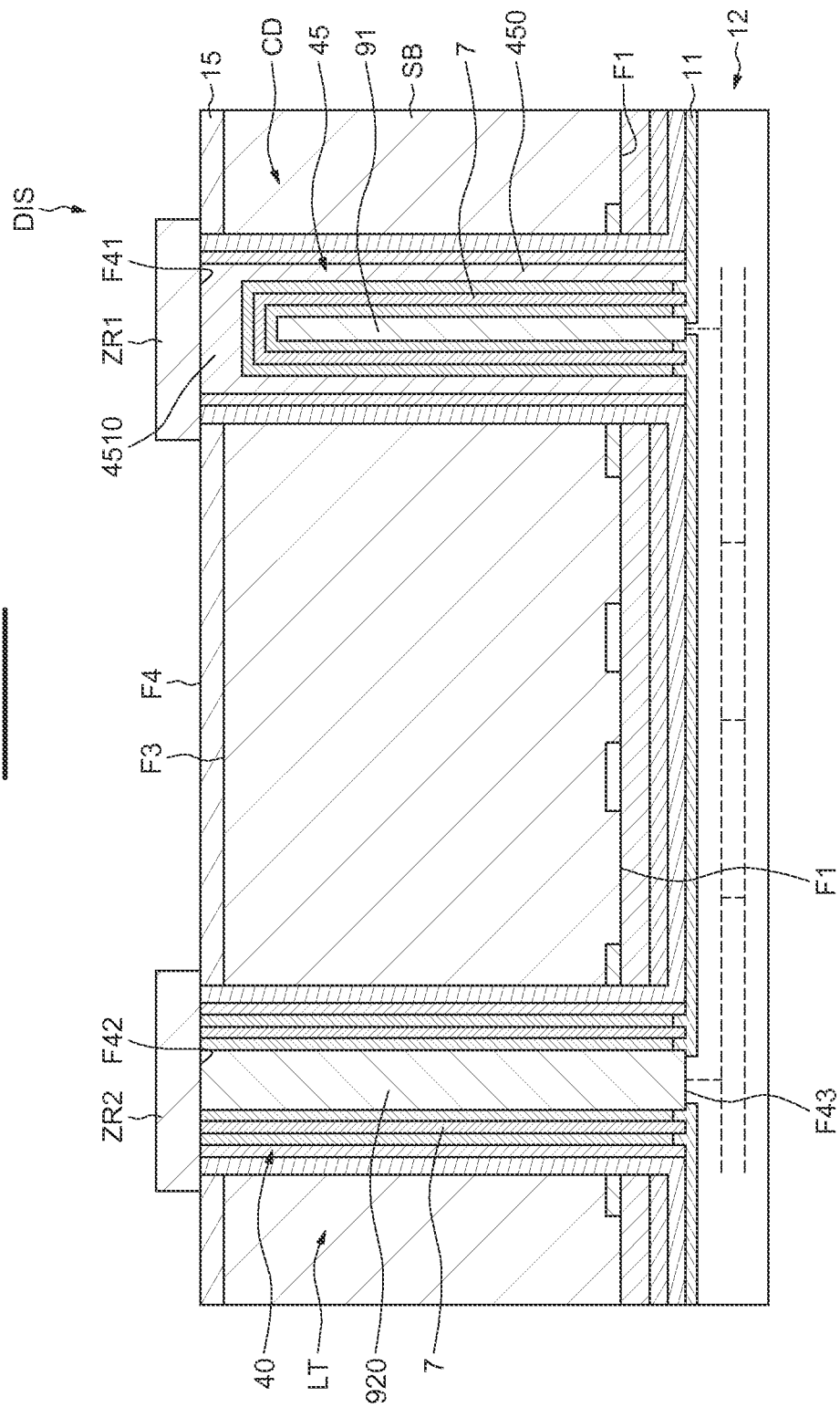

The process continues as shown in FIG. 13 with production, on the planar side F4, of a first electrically conductive zone ZR1 making contact with the first electrode region 45, and of a second electrically conductive zone ZR2 making contact with the through via LT. These two zones ZR1 and ZR2 may, for example, form part of a redistribution layer.

Therefore, a device comprising a substrate SB, an integrated-circuit interconnect part 12 placed on a first side F1 of the substrate SB, a through-silicon capacitor CD possessing a first electrode 45 having a first contact face F41 electrically coupled to the first electrically conductive zone ZR1 placed on a second side F3 (in this case the back side) of the substrate, and a second electrode 91 electrically coupled to the interconnect part 12, is obtained.

Moreover, the device comprises a through-silicon via LT passing through the substrate, having, at one end, a first contact face F42 electrically coupled to the second electrically conductive zone ZR2 placed on the second side F3 of the substrate, and, at the other end, a part F43 of the central part 920 of the via LT, coupled to the interconnect part 12.

Furthermore, the two contact faces F41 and F42 are located in the same plane.

The first electrode 45 of the capacitor comprises a tubular part 450 (here formed from copper and titanium nitride) connected to the bottom portion 4510 that possesses the first contact face F41. Furthermore, the second electrode 91 (here formed from copper and titanium nitride) is located inside the cylindrical part of the first electrode, and is separated from the latter by a dielectric region 7.

As for the through via LT, it comprises the electrically conductive central part 920, a first end of which forms part of the first contact face F42, and a second end F43 of which is connected to the interconnect part 12.

The through via also comprises a cylindrical dielectric region 7 encircling the central part and a first end of which also forms part of the first contact face F42.

In this embodiment, the through via LT furthermore comprises a cylindrical peripheral part 40, resulting from the first seed layer, encircling the central part 920 and the dielectric region 7, and a first end of which also forms part of the first contact face F42.

The device DIS is generally finished with electrical connection means, for example solder balls, electrically coupled to the zones ZR1 and ZR2, to be soldered, for example, to a printed circuit board. Moreover, contact pads may be produced, on the front side of the interconnect part 12, to hold electrically conductive pillars intended, for example, to be connected to another chip, in order to form a three-dimensional integrated structure. The device DIS is singulated by cutting the wafer PQ along scribe lines.

Of course, generally, the device DIS may comprise a plurality of through-silicon capacitors and a plurality of through-silicon vias that are produced simultaneously as described above. Thus, it is possible to produce large through-silicon capacitors the electrodes of which have large electrical connection areas and may easily be connected in many configurations, while achieving low electrical connection resistances. Thus, high integration densities are obtained.

In the method of implementation and embodiment illustrated in FIGS. 14 to 18, the blind orifices OR1, OR2 do not, this time round, have the same diameter. Only the differences between this method of implementation and embodiment and that just described with reference to FIGS. 1 to 13 will now be described.

Figure 14:
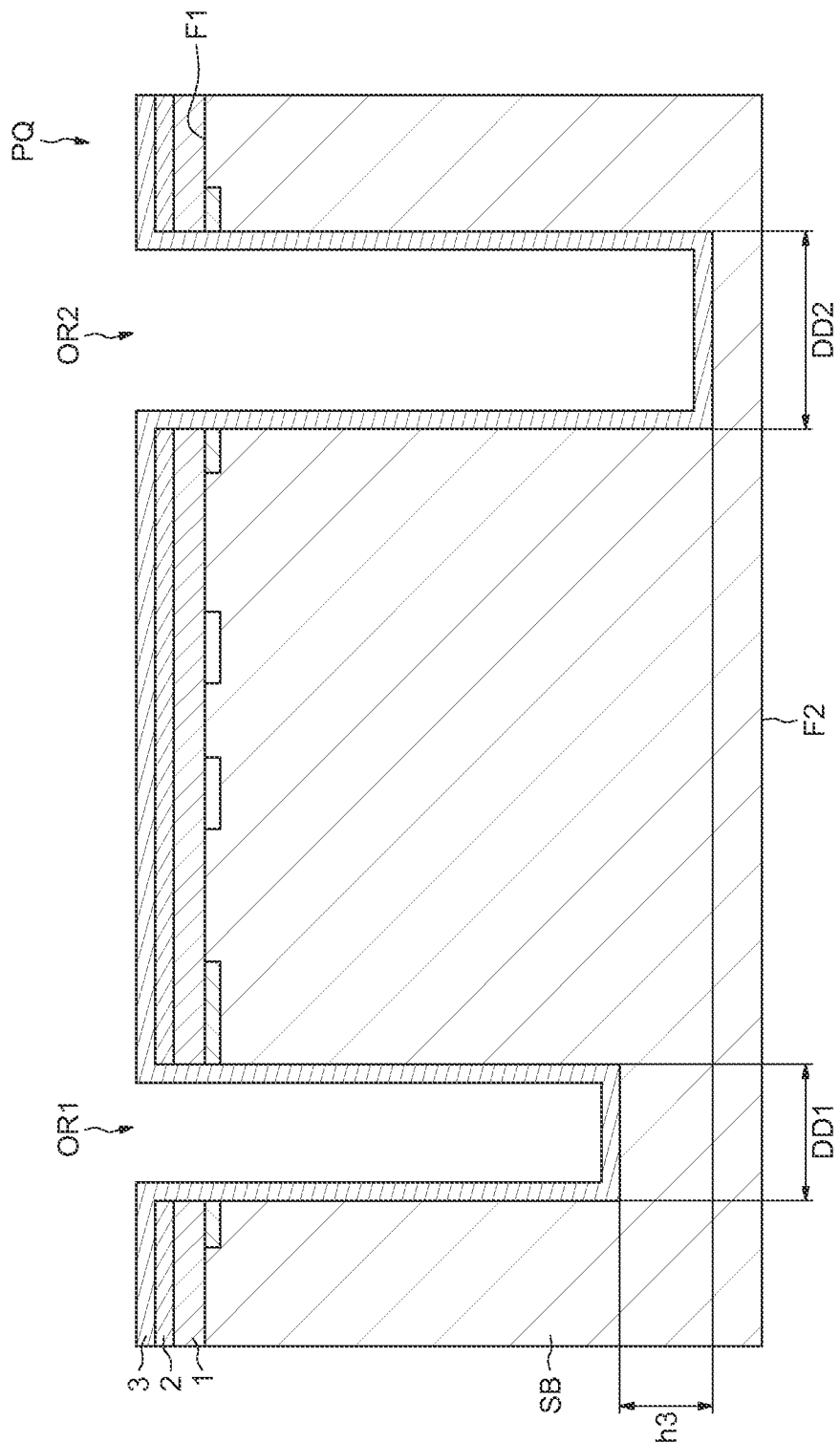

It may be seen in FIG. 14 that the diameter DD1 of the blind orifice OR1 intended to receive the through-silicon capacitor is smaller than the diameter DD2 of the blind orifice OR2 intended to receive the through via. Therefore, as a result, the orifice OR1 is less deep than the orifice OR2. By way of indication, if the diameters DD1 and DD2 are about 10 microns and 12 microns, respectively, the depth offset h3 may be comprised between 7 and 10 microns, in particular depending on the etching process and on the exposed area.

Figure 15:
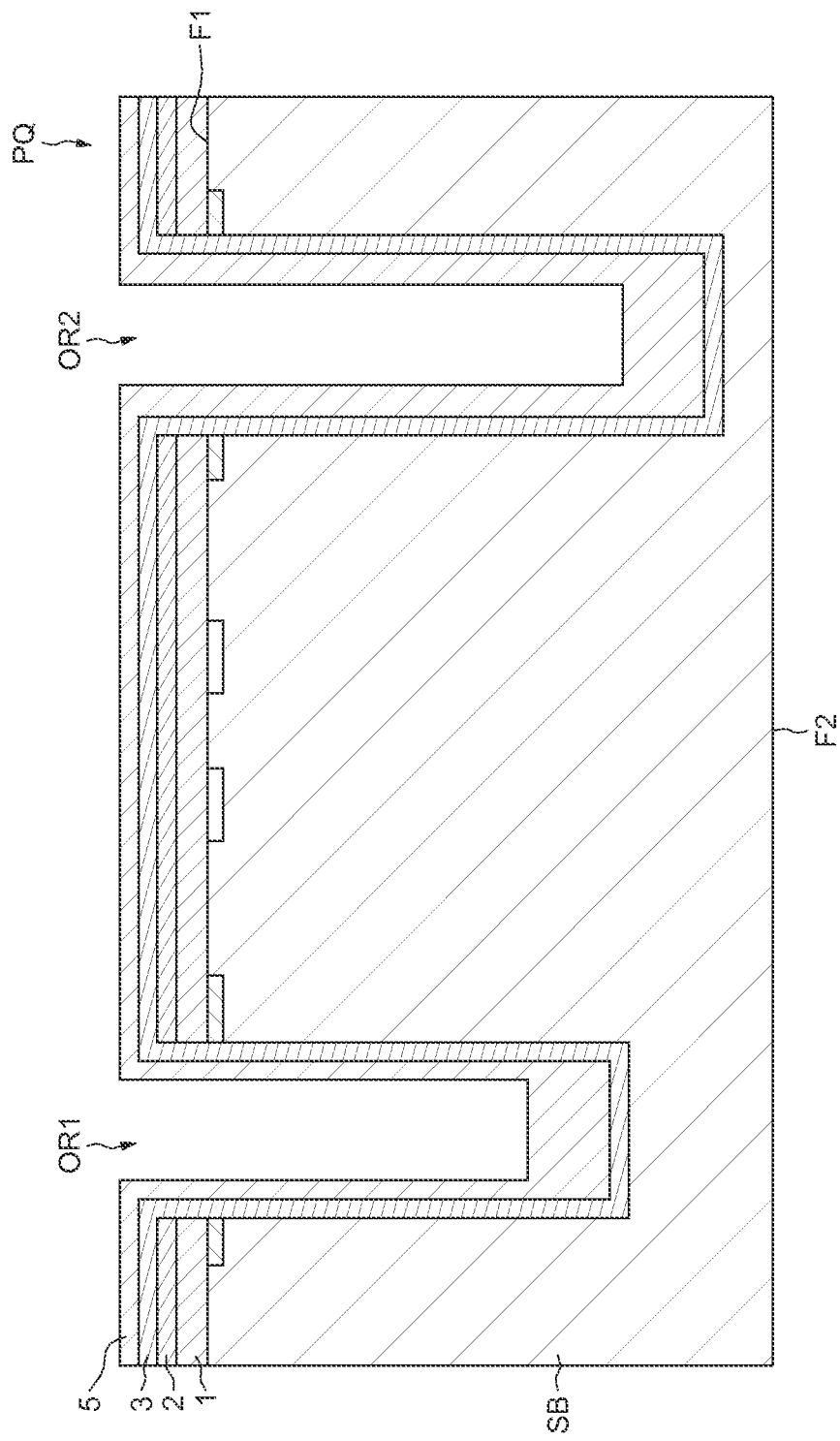

Next, as shown in FIG. 15, the orifices OR1, OR2 are partially filled by depositing, by electrolysis, the initial layer 5 from the first seed layer, which, this time, extends continuously over all of the structure.

Figure 16:
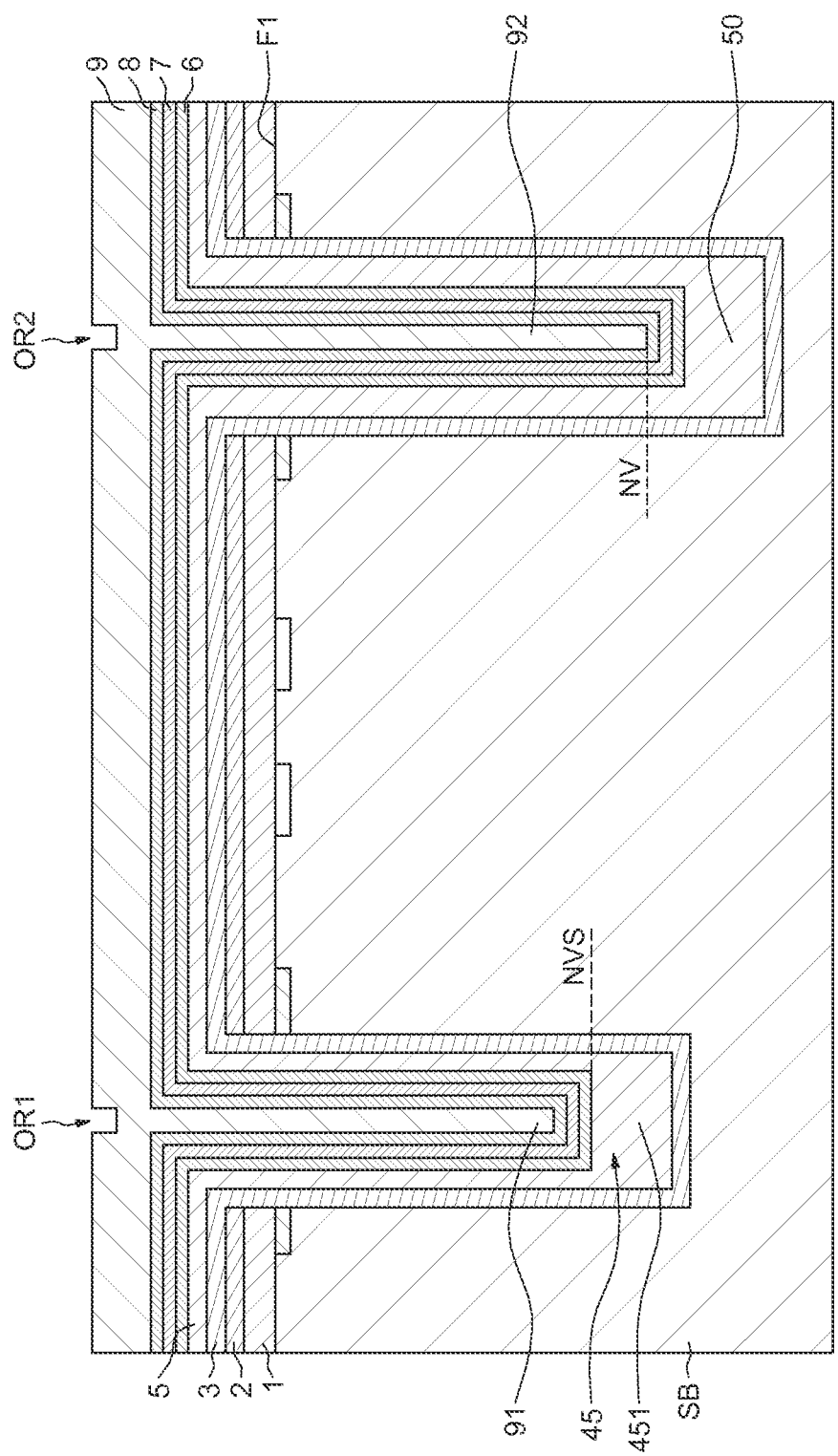

Next, as shown in FIG. 16, analogously to what was described above for the preceding embodiment, the multilayer of layers 6, 7, 8, 9 is formed in order to completely fill the orifices OR1, OR2. In this regard, the various depths and the heights of the layers 50 and 451 deposited in the bottom of the orifices OR1, OR2 have been chosen so that, as illustrated in FIG. 16, the bottom end of the additional layer 92 located in the second blind orifice OR2 is located at a depth level NV located below the top level NVS of the bottom portion 451 of the first electrode region 45.

Figure 17:
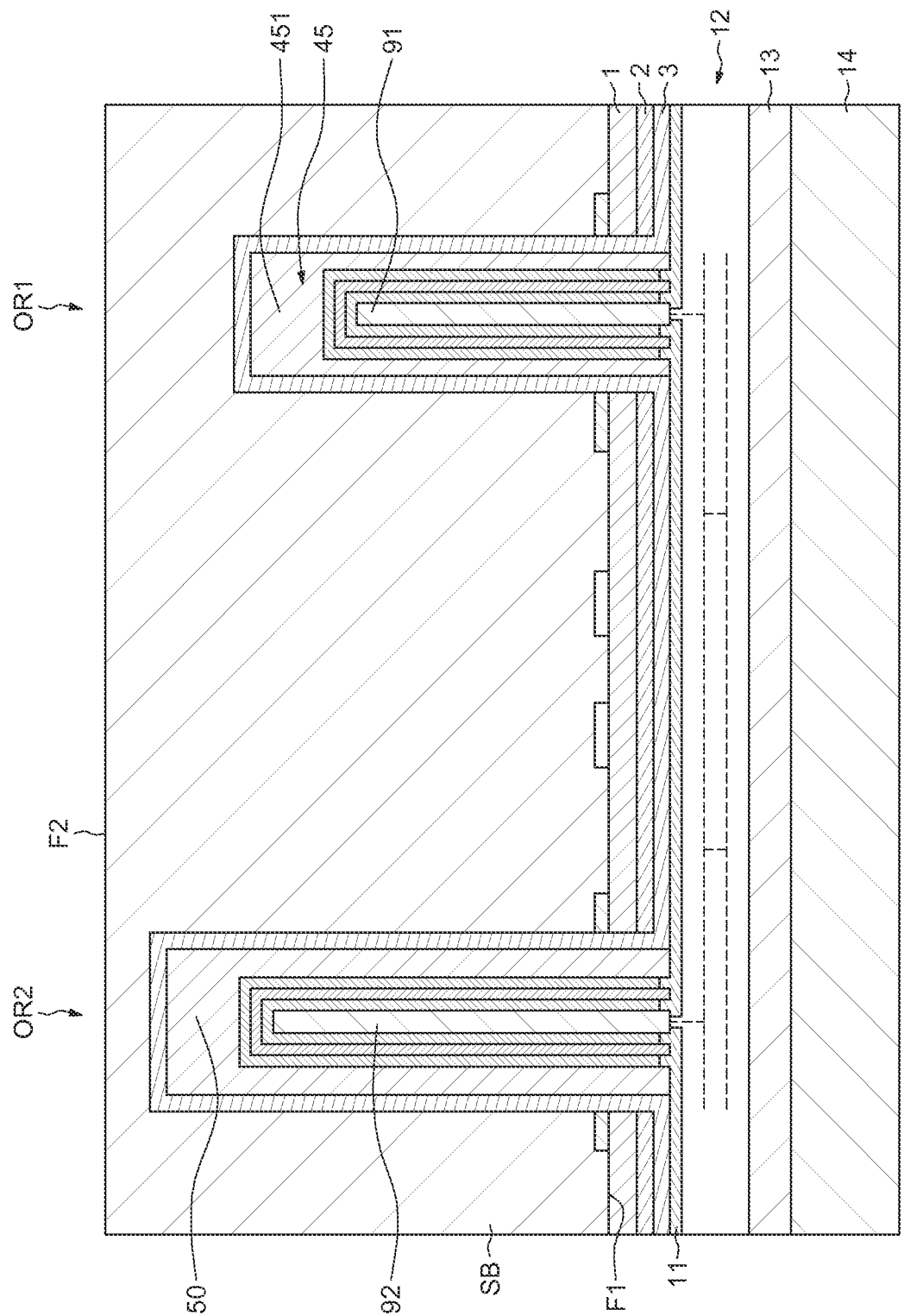
Figure 18:
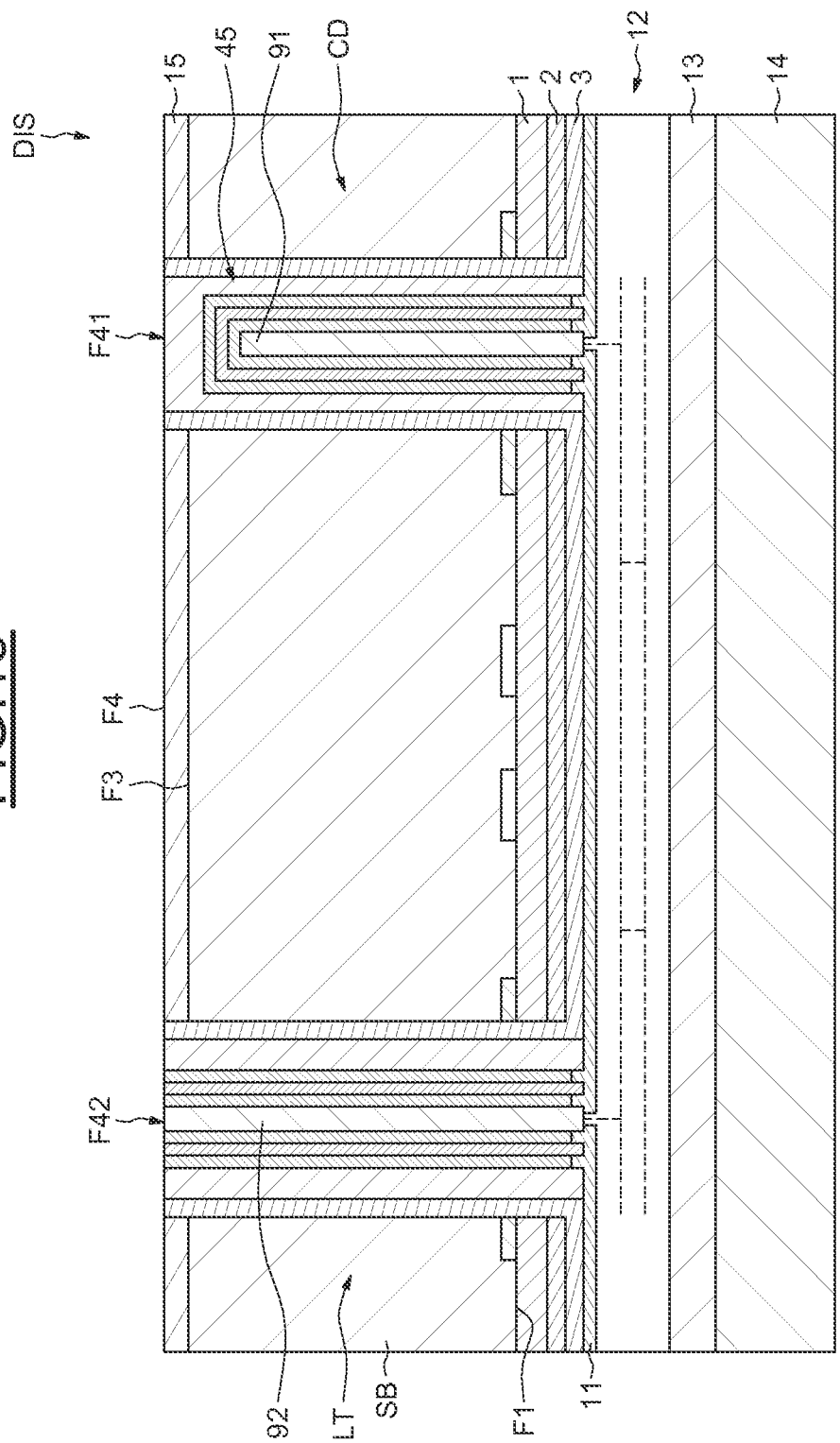

Next, as shown in FIG. 17, analogously to what was described above, the multilayer on the structure is removed, the interconnect part 12 is formed, and the carrier wafer 14 is temporarily bonded in place by adhesive means 13.

Figure 12:
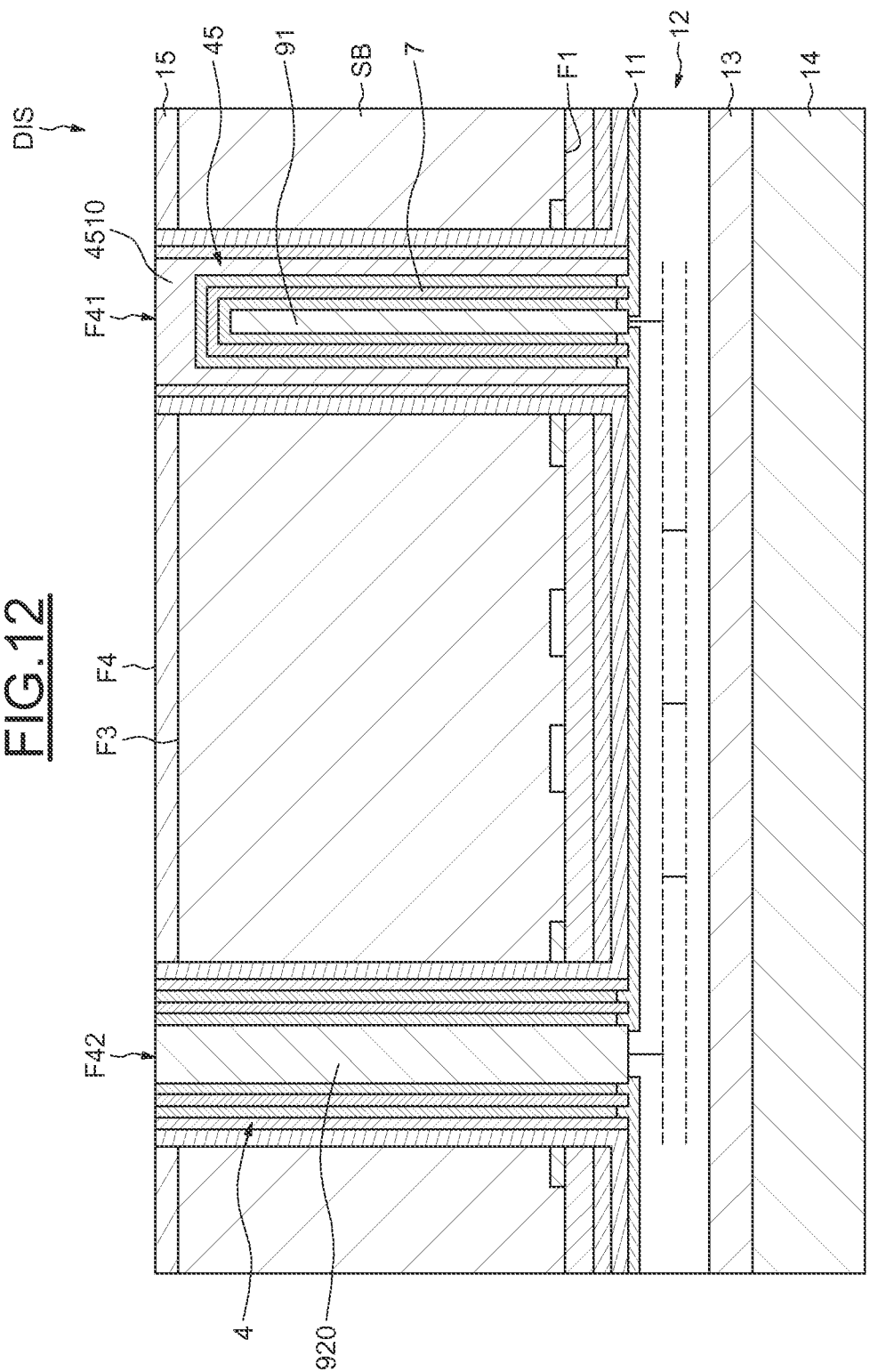

Next, analogously to what was described above, the orifices OR1, OR2 are subjected to a grinding treatment (see, FIG. 18) in order to obtain a device structure DIS analogous to that illustrated in FIG. 12. Here again, the contact faces F41, F42 are located in the same plane, this being made possible by virtue of the relationship described above between the levels NV and NVS.

After the zones ZR1, ZR2 have been produced a structure analogous to that in FIG. 13 is obtained.

As a variant, it would be possible not to deposit the copper layer 5 in the bottom of the orifice OR2.

What is claimed is:

1. A process for producing at least one through-silicon via and at least one through-silicon capacitor in a substrate, comprising:

forming, in the substrate from a first side, at least one first blind orifice intended for forming the capacitor and at least one second blind orifice intended for forming the through-silicon via;

forming a first electrode region of said capacitor at least on the side walls and on the bottom wall of the first blind orifice, said forming said first electrode region including forming an initial electrically conductive layer in said first blind orifice but not in the second blind orifice;

filling the first blind orifice and the second blind orifice by forming in the first orifice a multilayer comprising at least one dielectric layer and an additional electrically conductive layer on said dielectric layer, the additional electrically conductive layer forming a second electrode region of said capacitor, and by forming in the second orifice a multilayer comprising at least the additional electrically conductive layer in order to form at least one part of said through via;

thinning the substrate from a second side until the first and second blind orifices are exposed and the first electrode region in the first orifice is reached and the additional electrically conductive layer in the second orifice is reached allowing the through-silicon via to be formed; and producing a first electrically conductive zone making contact with said first electrode region and a second electrically conductive zone making contact with said through-silicon via.

2. The process according to claim 1, wherein the thinning of the substrate comprises forming a planar side onto which both the at least one part of said additional electrically conductive layer located in the first blind orifice and a part of the bottom portion of the first electrode region open, and the first electrically conductive zone making contact with said first electrode region and the second electrically conductive zone making contact with said through-silicon via are produced on said planar side.

3. The process according to claim 1, further comprising forming, on said first side, an integrated-circuit interconnect part making contact with said additional electrically conductive layers of the first and second orifices.

4. The process according to claim 1, wherein the blind orifices have a same depth, and a height of the bottom portion of the first electrode region is greater than a distance separating the bottom wall of the second blind orifice from said additional electrically conductive layer contained in this second blind orifice.

5. The process according to claim 1, wherein forming the first electrode region comprises forming an initial electrically conductive layer by electrolysis from a first electrically conductive seed layer.

6. The process according to claim 5, further comprising depositing said first seed layer in each of the blind orifices and on the first side of the substrate, and etching this first seed layer in a zone located on the first side of the substrate between the two blind orifices.

7. The process according to claim 1, wherein filling of the blind orifices comprises forming said multilayer also on the first side of the substrate, and removing said multilayer located on the first side of the substrate.

8. The process according to claim 7, wherein forming said multilayer comprises forming a blanket electrically conductive layer by electrolysis from a second seed layer, the portions of said blanket layer which are located in the orifices respectively forming said additional electrically conductive layers.

9. The process according to claim 1, wherein said additional electrically conductive layer present in said first orifice and said additional electrically layer present in said second orifice are obtained by the formation of a same electrically conductive layer.

10. A method, comprising:

forming a first blind orifice in a substrate from a front side;

forming a second blind orifice in the substrate from the front side;

forming a first metal layer in first blind orifice but not in the second blind orifice;

forming a multilayer structure in both the first blind orifice and second blind orifice, said multilayer structure comprising an outer metal layer, an insulating layer and an inner metal layer;

thinning the substrate from a back side until the first metal layer in first blind orifice is exposed and the outer and inner metal layers of the multilayer structure in the second blind orifice are exposed;

producing a first electrical contact on the thinned back side of the substrate in electrical connection with the exposed first metal layer to provide connection to a capacitor formed by the multilayer structure in the first blind orifice; and producing a second electrical contact on the thinned back side of the substrate in electrical connection with the exposed outer and inner metal layers in the second blind orifice to provide connection to a through silicon via formed at least in part by the multilayer structure in the second blind orifice.

11. The process of claim 10 wherein the first and second blind orifices have a same depth.

12. The process of claim 10 further comprising:

electrically isolating the second blind orifice from the first blind orifice; and wherein forming the first metal layer comprises forming the first metal layer by electrolysis.

13. The process of claim 10 further comprising filling an open part of the first and second orifices after forming a multilayer structure with a metal, the metal filling the open part in the second orifice further providing the through silicon via and the metal filling the open part in the first orifice providing an electrical contact to the capacitor.

14. A method, comprising:

forming a first blind orifice in a first side of a substrate;

forming a second blind orifice in the first side of the substrate;

depositing a metal region at a bottom of the first blind orifice;

forming a multilayer structure in both the first blind orifice and second blind orifice, said multilayer structure comprising an outer metal layer, an insulating layer and an inner metal layer, wherein the outer metal layer in the first blind orifice is in contact with the metal region at the bottom of the first blind orifice and not in contact with the second blind orifice;

thinning the substrate from a second side of the substrate opposite the first side until the metal region in first blind orifice is exposed and the outer and inner metal layers of the multilayer structure in the second blind orifice are exposed;

producing a first electrical contact on the thinned second side of the substrate in electrical connection with the metal region; and producing a second electrical contact on the thinned second side of the substrate in electrical connection with the exposed outer and inner metal layers in the second blind orifice.

15. The method of claim 14, further comprising forming, on said first side, an integrated-circuit interconnect part making contact with said additional electrically conductive layers of the first and second orifices.

16. The process of claim 14, further comprising electrically isolating the multilayer structure in the second blind orifice from the multilayer structure in the first blind orifice.

17. The process of claim 16, wherein the multilayer structure in the second blind orifice forms a through-silicon via and wherein the multilayer structure in the first blind orifice forms a capacitor.

* * * * *